United States Patent
Le-Gall

(12) United States Patent (10) Patent No.: US 8,571,822 B2
Le-Gall (45) Date of Patent: Oct. 29, 2013

(54) METHOD AND DEVICE FOR ANALYZING THE BEHAVIOR OF A POWER SUPPLY IN A CIRCUIT

(75) Inventor: Herve Le-Gall, Saint-Martin d'Uriage (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 427 days.

(21) Appl. No.: 12/949,675

(22) Filed: Nov. 18, 2010

(65) Prior Publication Data
US 2011/0125437 A1 May 26, 2011

(30) Foreign Application Priority Data

Nov. 24, 2009 (FR) ...................................... 09 05630

(51) Int. Cl.
*G01R 13/00* (2006.01)
*H04L 7/00* (2006.01)

(52) U.S. Cl.
USPC ........................................... 702/69; 375/371

(58) Field of Classification Search
USPC ........... 702/69, 57, 60, 64–66, 72, 75–76, 78,
702/81, 84, 108, 117–118, 125, 127, 179,
702/182–183, 185, 189, 196; 375/371, 373,
375/375–376; 324/76.77, 76.79, 500, 512,
324/521, 537; 370/241–242, 248–249;
714/699–700
See application file for complete search history.

(56) References Cited

U.S. PATENT DOCUMENTS

2003/0202573 A1 10/2003 Yamaguchi et al. .......... 375/226
2007/0002994 A1 1/2007 Kanter et al. ................. 375/376

FOREIGN PATENT DOCUMENTS

EP 1 841 066 A1 10/2007

OTHER PUBLICATIONS

Vamvakos et al., PLL On-Chip Jitter Measurement: Analysis and Design, 2006 IEEE, 2006 Symposium on VLSI Circuits Digest of Technical Papers, 2 pp.*

* cited by examiner

*Primary Examiner* — Toan Le
(74) *Attorney, Agent, or Firm* — Seed IP Law Group PLLC

(57) ABSTRACT

A method for testing an integrated circuit, the method including performing a series of at least three tests, each including: selecting two nodes among at least three nodes for taking a clock signal from an integrated circuit, taking two clock signals at the two selected taking nodes during a test duration, detecting and counting events appearing in a jitter signal between the two clock signals taken, during the test duration, and determining from numbers of events counted a test result proportional to a sum of jitter variances of the two clock signals taken, and at the end of the series of tests, determining by a matrix calculation the jitter variance of each clock signal taken.

30 Claims, 5 Drawing Sheets

METHOD AND DEVICE FOR ANALYZING THE BEHAVIOR OF A POWER SUPPLY IN A CIRCUIT

BACKGROUND

1. Technical Field

The present disclosure generally relates to the manufacture and test of integrated circuits, including by way of example, Systems On Chips SOC.

2. Description of the Related Art

New integration technologies tend to offer a higher density of transistors and more rapid interconnections. By integrating heterogeneous circuits on a same chip to make a "system on chip", it is possible to reduce the times and costs for designing and manufacturing such systems.

Thus, Systems On Chip SOC increasingly tend to gather into a same integrated circuit hardware components such as heterogeneous processor cores, specialized circuits, and memories, as well as a complex communication architecture called "Network On Chip" NOC, linking these components between them. Due to the increasing complexity of systems on chip, it is desirable to implement design, modeling and simulation tools allowing a system to be tested at different designing steps, so as to be able to validate the system at each of these steps. It is also desirable to be able to test a system or an integrated circuit once it is totally or partially embedded into a chip. Now, testing integrated circuits becomes more and more expensive and constitutes a great part of the total manufacturing cost of the circuit. To reduce the cost of these tests, additional circuits, called integrated testing circuits may be provided during the manufacture of the integrated circuit to perform these tests. These tests are usually called Built-In Self Tests BIST.

In addition, built-in self tests increasingly tend to allow the performances of the system to be analyzed. During an adjusting phase, these tests may be applied to an isolated part of the system. These tests may concern the sources of clock signals such as phase-lock loops PLL, frequency synthesizers, clock trees, interconnections between the different parts of the system, and also the noise generated by the parts of the system. Analyzing the integrity of signals may be performed by a frequency analysis, a parameter analysis S, a jitter analysis, etc. The integrity of the supply voltages of a system is a crucial point for high speed serial links, and in particular for memory interfaces. The supply voltages in an integrated circuit may be subjected to disturbances which importance may be linked to the length of the links supplying these voltages to the different parts of the integrated circuit. The supply voltages may also be subjected to variations resulting in particular from the activity of the various parts of the integrated circuit.

However, analyzing the integrity of supply voltages, which may be performed in the frequency domain, is highly complex due to the small amplitude of the oscillations appearing in the supply voltages. Generally, there is no metric means allowing the supply voltage integrity to be characterized.

It is however desirable to be able to test an integrated circuit so as to obtain significant and reliable information on the integrity of supply voltages of the integrated circuit.

BRIEF SUMMARY

Embodiments may relate to a method for testing an integrated circuit, comprising performing a series of at least three tests, each test comprising: selecting two nodes among at least three taking nodes for taking a clock signal, from an integrated circuit, taking two clock signals at the two selected taking nodes during a test duration, detecting and counting events appearing in a jitter signal between the two clock signals taken, during the test duration, and determining from numbers of events counted a test result proportional to a sum of jitter variances of the two clock signals taken, the method comprising determining the jitter variance of each clock signal taken during the series of tests, the number of tests of the series of tests and the signals taken at each test of the series of tests being chosen so as to be able to determine by a matrix calculation the jitter variance of each clock signal taken.

According to one embodiment, the jitter variance of a clock signal taken at a node at a distance from an output of a generation circuit for generating the clock signal, is equal to a jitter variance of the clock signal at the output of the circuit for generating the clock signal taken, plus a jitter variance introduced by a link transmitting the clock signal between the output of the generation circuit and the clock signal taking node, the method comprising determining the jitter variance of the clock signal at the output of the clock signal generation circuit, and the jitter variance introduced by the link between the output of the clock signal generation circuit and the node for taking the clock signal taken, the number of tests of the series of tests and the signals taken at each test of the series of tests being chosen so as to be able to determine by a matrix calculation the jitter variance of each clock signal at the output of the generation circuit thereof and the jitter variance of each link between a selected point for taking a clock signal and the output of the clock signal generation circuit.

According to one embodiment the method comprises taking a sample of a first out of the two taken signals at each period of a second of the taken signals, and memorizing the samples taken, the events counted comprising events of apparition of a particular pattern or matching a particular mask, in the memorized samples, and events of phase matching between the two taken signals.

According to one embodiment, the result of each test of the series of tests is obtained using the following formula:

$$R = \left( \frac{NA + NB}{NTc} \cdot |Tobs - Tref| \right)^2$$

where R is the result of the test, NA and NB are the values of two counters of apparition of a particular pattern in the memorized samples or matching the memorized samples with a particular mask, NTc is the value of a counter incremented each time the two taken signals are detected in phase, and Tobs and Tref are the periods of the two taken signals.

According to one embodiment, the method comprises providing in the integrated circuit at least one supply voltage integrity analysis circuit comprising a jitter measurement circuit and multiplexers allowing clock signals to be taken and clock signal taking nodes to be selected.

According to one embodiment, the method comprises providing in the integrated circuit at least several supply voltage integrity analysis circuits, each comprising a jitter measurement circuit and multiplexers allowing clock signals to be taken and clock signal taking nodes to be selected, the supply voltage integrity analysis circuits being located on the integrated circuit between the blocks of the integrated circuit or near sources of clock signals.

According to one embodiment, the method comprises performing the series of tests in various operating conditions of the integrated circuit, comparing jitter variances obtained at each series of test, and deducing information relating to the integrity of supply voltages.

Embodiments also may relate to a system for testing an integrated circuit, configured to implement embodiments of the methods as previously described.

Embodiments also may relate to an integrated circuit comprising at least one clock signal generation circuit, clock signal taking nodes, and a supply voltage integrity analysis circuit configured to: receive a testing device for testing signals for selecting two clock signal taking nodes, among at least three taking nodes, take two clock signals at the two selected taking nodes during a test duration, detect and count events appearing in a jitter signal between the two clock signals taken, during the test duration, and supply to the testing device the numbers of events counted.

According to one embodiment, the supply voltage integrity analysis circuit comprises a jitter measurement circuit and multiplexers allowing clock signals to be taken and clock signal taking nodes to be selected.

According to one embodiment, the integrated circuit comprises several supply voltage integrity analysis circuits, each comprising a jitter measurement circuit and multiplexers allowing clock signals to be taken and clock signal taking nodes to be selected, the supply voltage integrity analysis circuits being located on the integrated circuit between the blocks of the integrated circuit or near sources of clock signals.

Embodiments also may relate to a testing device comprising a connection interface for connecting to an integrated circuit, and means for sending and receiving signals through the connection interface, the testing device being configured to perform a series of at least three tests, each test comprising: controlling the selection by the integrated circuit connected to the connection interface, of two nodes among at least three taking nodes for taking a clock signal, taking by the integrated circuit two clock signals at the two selected taking nodes, during a test duration, and detecting and counting events appearing in a jitter signal between the two clock signals taken, during the test duration, and getting and determining from numbers of events counted a test result proportional to a sum of jitter variances of the two clock signals taken, the testing device being configured to determine the jitter variance of each clock signal taken during the series of tests, the number of tests of the series of tests and the signals taken at each test of the series of tests being chosen so as to be able to determine by a matrix calculation the jitter variance of each clock signal taken.

According to one embodiment, the jitter variance of a clock signal taken at a node at a distance from an output of a clock signal generation circuit, is equal to a jitter variance of the clock signal at the output of the circuit for generating the clock signal taken, plus a jitter variance introduced by a link transmitting the clock signal between the output of the generation circuit and the clock signal taking node, the testing device being configured to determine the jitter variance of the clock signal at the output of the clock signal generation circuit, and the jitter variance introduced by the link between the output of the clock signal generation circuit and the node for taking the clock signal taken, the number of tests of the series of tests and the signals taken at each test of the series of tests being chosen so as to be able to determine by a matrix calculation the jitter variance of each clock signal at the output of the generation circuit thereof and the jitter variance of each link between a selected point for taking a clock signal and the output of the clock signal generation circuit.

According to one embodiment, the testing device is configured to calculate a result of each of the tests of the series of tests using the following formula:

$$R = \left(\frac{NA+NB}{NTc} \cdot |Tobs - Tref|\right)^2$$

where R is the result of the test, NA and NB are the values of two counters of apparition of a particular pattern in the memorized samples or matching the memorized samples with a particular mask, NTc is the value of a counter incremented each time the two taken signals are detected in phase, and Tobs and Tref are the periods of the two taken signals.

According to one embodiment, the testing device is configured to perform the series of tests in various operating conditions of the integrated circuit, and comparing the jitter variances obtained at each series of test.

In an embodiment, a method, performed under control of at least one processing device, comprises: selecting a series of at least three tests of an integrated circuit; performing the selected series of at least three tests on the integrated circuit, each test comprising: selecting two nodes among at least three taking nodes for taking clock signals, from the integrated circuit; taking two clock signals at the two selected taking nodes during a test duration; detecting and counting events appearing in a jitter signal between the two clock signals taken, during the test duration; and determining from numbers of events counted, a test result proportional to a sum of jitter variances of the two clock signals taken during the test duration; and determining a jitter variance of each clock signal taken during the series of tests using a matrix calculation based on the results of the series of tests. In an embodiment, the jitter variance of a clock signal taken at a node at a distance from an output of a generation circuit for generating the clock signal, is equal to a jitter variance of the clock signal at the output of the circuit for generating the clock signal taken, plus a jitter variance introduced by a link transmitting the clock signal between the output of the generation circuit and the node for taking the clock signal, the method comprising determining the jitter variance of the clock signal at the output of the clock signal generation circuit, and the jitter variance introduced by the link between the output of the clock signal generation circuit and the node for taking the clock signal taken, wherein selecting a series of tests comprises determining a number of tests of the series of tests and the signals taken at each test of the series of tests so as to be able to determine by the matrix calculation the jitter variance of each clock signal at the output of the generation circuit thereof and the jitter variance of each link between a selected point for taking a clock signal and the output of the clock signal generation circuit. In an embodiment, performing the series of tests comprises taking a sample of a first out of the two taken signals at each period of a second of the taken signals, and storing the samples taken, the events counted comprising events of apparition of a particular pattern or matching a particular mask, in the stored samples, and events of phase matching between the two taken signals. In an embodiment, the test result of each test of the series of tests is obtained by a following formula:

$$R = \left(\frac{NA+NB}{NTc} \cdot |Tobs - Tref|\right)^2$$

where R is the result of the test, NA and NB are the values of two counters of apparition of a particular pattern in the stored samples or matching the stored samples with a particular mask, NTc is the value of a counter incremented each time the two taken signals are detected in phase, and Tobs and Tref are periods of the two taken signals. In an embodiment, the method comprises providing in the integrated circuit at least one circuit for analyzing supply voltage integrity comprising a jitter measurement circuit and multiplexers allowing clock signals to be taken and taking nodes for taking clock signals to be selected. In an embodiment, the method comprises providing in the integrated circuit a plurality of supply voltage integrity analysis circuits, each comprising a jitter measurement circuit and multiplexers allowing clock signals to be taken and clock signal taking nodes to be selected, the supply voltage integrity analysis circuits being located on the integrated circuit between blocks of the integrated circuit or near sources of clock signals. In an embodiment, the method comprises performing the series of tests in various operating conditions of the integrated circuit, comparing jitter variances obtained at each series of tests, and deducing therefrom information relating to an integrity of supply voltages. In an embodiment, the at least one processing device comprises a processing block of the integrated circuit.

In an embodiment, an integrated circuit comprises: at least one clock generator configured to generate a clock signal; at least three clock signal taking nodes; and analysis logic configured to: receive test control signals of a test of the integrated circuit; select, based on the test control signals, two clock signal taking nodes among the at least three taking nodes; take two clock signals at the two selected clock signal taking nodes during a test duration; and detect and count events appearing in a jitter signal between the two clock signals taken, during the test duration. In an embodiment, the analysis logic comprises a jitter measurement block and multiplexers configured to select clock signal taking nodes. In an embodiment, the analysis logic comprises a plurality of supply voltage integrity analysis logic blocks, each supply voltage integrity analysis logic block comprising a jitter measurement circuit and multiplexers configured to select clock signal taking nodes, the respective supply voltage integrity analysis logic blocks located on the integrated circuit between functional blocks of the integrated circuit or near sources of clock signals. In an embodiment, the integrated circuit further comprises: an interface configured to couple the analysis logic to a testing device, wherein the interface is configured to provide test control signals generated by the testing device to the analysis logic and to provide numbers of events counted by analysis logic to the testing device.

In an embodiment, a testing device comprises: a connection interface configured to couple to an integrated circuit; and testing logic coupled to the connection interface and configured to: perform a series of at least three tests, each test comprising: generating test control signals to control selection by the integrated circuit, of two nodes among at least three clock signal taking nodes; generating test control signals to control taking by the integrated circuit of two clock signals at the two selected taking nodes, during a test duration, and detecting and counting by the integrated circuit of events appearing in a jitter signal between the two taken clock signals, during the test duration; and determining from numbers of events counted a test result proportional to a sum of jitter variances of the two clock signals taken; and determine a jitter variance of each clock signal taken during the series of tests using a matrix calculation based on the determined test results of the series of tests. In an embodiment, the jitter variance of a clock signal taken at a node at a distance from an output of a clock signal generation circuit, is equal to a jitter variance of the clock signal at the output of the generation circuit of the clock signal taken, plus a jitter variance introduced by a link transmitting the clock signal between the output of the generation circuit and the clock signal taking node, wherein the testing device is configured to determine the jitter variance of the clock signal at the output of the clock signal generation circuit, and the jitter variance introduced by the link between the output of the clock signal generation circuit and the node for taking the clock signal taken, wherein the number of tests of the series of tests and the signals taken at each test of the series of tests are selected so as to be able to determine by a matrix calculation the jitter variance of each clock signal at the output of the generation circuit thereof and the jitter variance of each link between a selected point for taking a clock signal and the output of the clock signal generation circuit. In an embodiment, the testing logic is configured to calculate a result of each of the tests of the series of tests using a following formula:

$$R = \left(\frac{NA + NB}{NTc} \cdot |Tobs - Tref|\right)^2$$

where R is the result of the test, NA and NB are values of two counters of apparition of a particular pattern in stored samples or matching the stored samples with a particular mask, NTc is a value of a counter incremented each time the two taken signals are detected in phase, and Tobs and Tref are periods of the two taken signals. In an embodiment, the testing logic is configured to perform the series of tests in various operating conditions of the integrated circuit, and comparing the jitter variances obtained at each series of test.

In an embodiment, a system comprises: an integrated circuit, having: at least one clock signal generator; at least three clock signal taking nodes; and supply voltage integrity analysis logic configured to: receive test control signals of a test of the integrated circuit; select, based on the test control signals, two clock signal taking nodes among the at least three taking nodes; take two clock signals at the two selected clock signal taking nodes during a test duration; and detect and count events appearing in a jitter signal between the two clock signals taken, during the test duration; and a testing device configured to generate the test control signals and to receive numbers of events counted by the supply voltage integrity analysis logic. In an embodiment, the supply voltage integrity analysis logic comprises a jitter measurement block and multiplexers configured to select clock signal taking nodes. In an embodiment, supply voltage integrity analysis logic comprises a plurality of supply voltage integrity analysis logic blocks, each supply voltage integrity analysis logic block comprising a jitter measurement circuit and multiplexers configured to select clock signal taking nodes, the respective supply voltage integrity analysis logic blocks located on the integrated circuit between functional blocks of the integrated circuit or near sources of clock signals. In an embodiment, the system further comprises: an interface configured to couple the integrated circuit to the testing device, wherein the interface is configured to provide test control signals generated by the testing device to the supply voltage integrity analysis logic and to provide numbers of events counted by supply voltage integrity analysis logic to the testing device. In an embodiment, the testing device comprises testing logic configured to generate test control signals for a series of tests and determine a jitter variance of each clock signal taken during the series of tests using a matrix calculation based on the received numbers of events.

In an embodiment, a non-transitory computer-readable medium's contents cause at least one processing device to perform a method, the method comprising: selecting a series of at least three tests of an integrated circuit; performing the selected series of at least three tests on the integrated circuit, each test comprising: selecting two nodes among at least three taking nodes for taking clock signals, from the integrated circuit; taking two clock signals at the two selected taking nodes during a test duration; detecting and counting events appearing in a jitter signal between the two clock signals taken, during the test duration; and determining from numbers of events counted, a test result proportional to a sum of jitter variances of the two clock signals taken during the test duration; and determining a jitter variance of each clock signal taken during the series of tests using a matrix calculation based on the results of the series of tests. In an embodiment, the jitter variance of a clock signal taken at a node at a distance from an output of a generation circuit for generating the clock signal, is equal to a jitter variance of the clock signal at the output of the circuit for generating the clock signal taken, plus a jitter variance introduced by a link transmitting the clock signal between the output of the generation circuit and the node for taking the clock signal, the method comprising determining the jitter variance of the clock signal at the output of the clock signal generation circuit, and the jitter variance introduced by the link between the output of the clock signal generation circuit and the node for taking the clock signal taken, wherein selecting a series of tests comprises determining a number of tests of the series of tests and the signals taken at each test of the series of tests so as to be able to determine by the matrix calculation the jitter variance of each clock signal at the output of the generation circuit thereof and the jitter variance of each link between a selected point for taking a clock signal and the output of the clock signal generation circuit. In an embodiment, performing the series of tests comprises taking a sample of a first out of the two taken signals at each period of a second of the taken signals, and storing the samples taken, the events counted comprising events of apparition of a particular pattern or matching a particular mask, in the stored samples, and events of phase matching between the two taken signals. In an embodiment, the test result of each test of the series of tests is obtained by a following formula:

$$R = \left(\frac{NA + NB}{NTc} \cdot |Tobs - Tref|\right)^2$$

where R is the result of the test, NA and NB are the values of two counters of apparition of a particular pattern in the stored samples or matching the stored samples with a particular mask, NTc is the value of a counter incremented each time the two taken signals are detected in phase, and Tobs and Tref are periods of the two taken signals. In an embodiment, the integrated circuit comprises at least one block configured to analyze supply voltage integrity and having a jitter measurement circuit and multiplexers configured to select taking nodes for taking clock signals. In an embodiment, the method comprises performing the series of tests in various operating conditions of the integrated circuit, comparing jitter variances obtained at each series of tests, and deducing therefrom information relating to an integrity of supply voltages.

In an embodiment, a system comprises: means for selecting a series of at least three tests of an integrated circuit; means for performing the selected series of at least three tests on the integrated circuit, each test comprising: selecting two nodes among at least three taking nodes for taking clock signals, from the integrated circuit; taking two clock signals at the two selected taking nodes during a test duration; detecting and counting events appearing in a jitter signal between the two clock signals taken, during the test duration; and determining from numbers of events counted, a test result proportional to a sum of jitter variances of the two clock signals taken during the test duration; and means for determining a jitter variance of each clock signal taken during the series of tests using a matrix calculation based on the results of the series of tests. In an embodiment, the jitter variance of a clock signal taken at a node at a distance from a clock signal generator is equal to a jitter variance of the clock signal at the clock signal generator plus a jitter variance introduced by a link transmitting the clock signal between the clock signal generator and the node for taking the clock signal, the system comprising means for determining the jitter variance of the clock signal at the clock signal generator, and the jitter variance introduced by the link between the output of the clock signal generator and the node for taking the clock signal taken, wherein the means for selecting a series of tests comprises means for determining a number of tests of the series of tests and the signals taken at each test of the series of tests so as to be able to determine by the matrix calculation the jitter variance of each clock signal at the output of the generation circuit thereof and the jitter variance of each link between a selected point for taking a clock signal and the output of the clock signal generator. In an embodiment, wherein the means for performing is configured to take a sample of a first out of the two taken signals at each period of a second of the taken signals, and store the samples taken, the events counted comprising events of apparition of a particular pattern or matching a particular mask, in the stored samples, and events of phase matching between the two taken signals.

BRIEF DESCRIPTION OF THE SEVERAL VIEWS OF THE DRAWINGS

Embodiments of the disclosure will be described hereinafter, in relation with, but not limited to the appended figures wherein.

DETAILED DESCRIPTION

Figure 1:
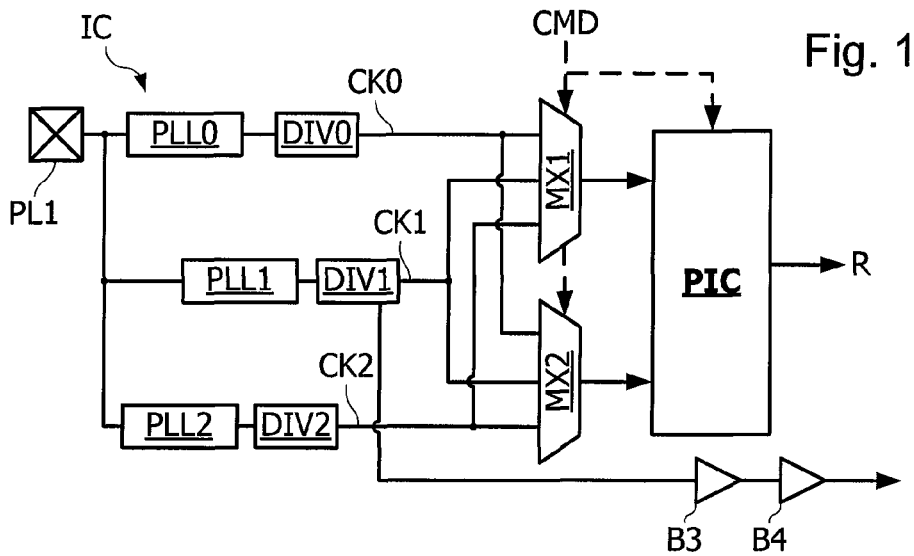
FIG. 1 schematically shows a circuit for analyzing the integrity of supply voltages in an integrated circuit, according to one embodiment.

In the following description, certain details are set forth in order to provide a thorough understanding of various embodiments of devices, methods and articles. However, one of skill in the art will understand that other embodiments may be practiced without these details. In other instances, well-known structures and methods associated with, for example, integrated circuits and multiplexers, have not been shown or described in detail in some figures to avoid unnecessarily obscuring descriptions of the embodiments.

Unless the context requires otherwise, throughout the specification and claims which follow, the word "comprise"

and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure or the claims.

The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not necessarily intended to convey any information regarding the actual shape of particular elements, and have been selected solely for ease of recognition in the drawings.

FIG. 1 shows a supply voltage integrity analysis circuit in an integrated circuit IC, according to one embodiment. In FIG. 1, the integrated circuit IC comprises a connection pad PL1 connected to clock signal generation circuits PLL0, PLL1, PLL2. An output of each circuit PLL0, PLL1, PLL2 is connected to a respective frequency divider DIV0, DIV1, DIV2. The integrated circuit IC also comprises two multiplexers MX1, MX2, each connected in input to an output of each of the dividers DIV0, DIV1, DIV2. Another output of the divider DIV1 is for example linked to another part of the integrated circuit IC through two transfer gates B3, B4. Each multiplexer MX1, MX2 comprises an output connected to a respective input of clock signal of a supply voltage integrity analysis circuit PIC.

Figure 2:
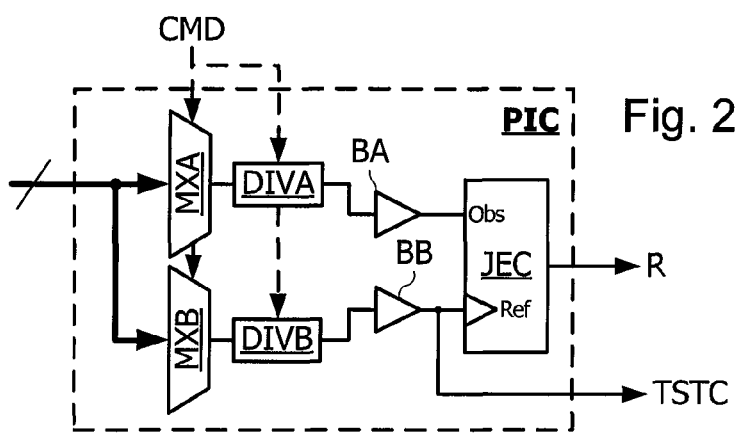
FIG. 2 shows the analysis circuit of FIG. 1, according to one embodiment, FIG. 3 schematically shows a jitter measurement circuit.

FIG. 2 shows an example embodiment of the supply voltage integrity analysis circuit PIC. In FIG. 2, the circuit PIC comprises a jitter measurement circuit JEC and two multiplexers MXA, MXB, each comprising several inputs, each input of the multiplexer MXA being connected with an input of the multiplexer MXB to an input of the circuit PIC. Each multiplexer MXA, MXB comprises an output respectively linked to an input of signal to be measured Obs and to an input of reference clock signal Ref of the circuit JEC through a respective frequency divider DIVA, DIVB and a respective transfer gate BA, BB. The transfer gates BA and BB are provided in the circuit to compensate the propagation times of the signals through the various links of the circuit.

The multiplexers MX1, MX2, MXA, MXB are controlled by a command word CMD emitted by a testing device (not shown) to select two out of the three clock signals CK0, CK1, CK2 at the output of the dividers DIV0, DIV1, DIV2 to be applied respectively to the input Ref and the input Obs of the circuit JEC. The dividers DIVA, DIVB are also controlled by the command word so that the signals applied to the input of the circuit JEC have the same frequency. The circuit JEC supplies a measure R allowing a value proportional to the sum of the jitter variances of each signal supplied to the input of the measurement circuit to be deduced.

Figure 3:
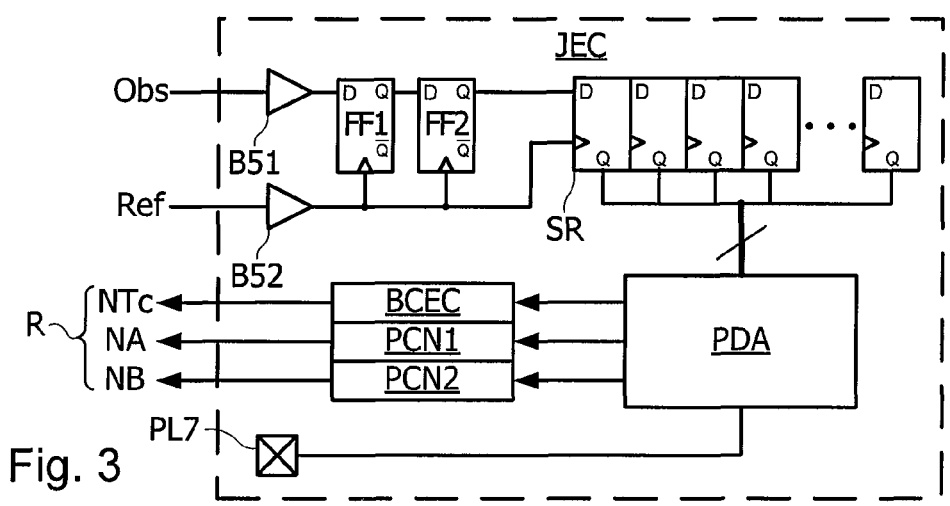

FIG. 3 shows an example embodiment of a jitter measurement circuit JEC measuring jitter between two clock signals. In FIG. 3, the circuit JEC comprises two flip-flops FF1, FF2, for example of D type, mounted in cascade. The flip-flop FF1 receives on one input D the signal to be measured Obs, through a transfer gate B51. An output Q of the gate FF1 is connected to an input D of the flip-flop FF2. The flip-flops FF1 and FF2 receive on one clock input the reference signal Ref, through a transfer gate B52. The output Q of the gate FF2 is connected to an input of a shift register SR1 receiving on a clock input the reference signal Ref at the output of the gate B52. The output of the shift register is connected to a circuit configured to detect and analyze patterns PDA. The shift register SR1 comprises for example several flip-flops of D type mounted in cascade and which outputs Q are connected to the circuit PDA. The circuit PDA controls the incrementation and initialization of a set of counters comprising a beat edge counter BCEC, and two counters for detecting particular patterns PCN1, PCN2. The beat edge counter BCEC is incremented by one each time the circuit PDA detects that the two signals Ref and Obs are in phase. The two flip-flops FF1, FF2 allow a sample of the signal Obs to be taken at each period of the signal Ref, for example at each rising edge of the signal Ref. The samples taken are memorized in the shift register SR1, for example of 12 bits. The counters PCN1, PCN2 are incremented by one by the circuit PDA each time the binary word in the shift register SR1 has a particular value or matches a mask, memorized by the circuit PDA, i.e., when certain bits of the binary word in the register SR1 have particular values. The circuit PDA is controlled and configured by signals coming from one or more connection pads PL7 connected to a testing device, such as TSTT, making it possible to transmit to the circuit PDA, patterns or pattern masks to be detected in particular. The patterns or masks supplied to the circuit PDA are for example chosen to detect rising and falling edges in the signal observed. To that end, for example, two patterns or masks supplied to the circuit PDA may be binary words opposite to one another.

Figure 4:
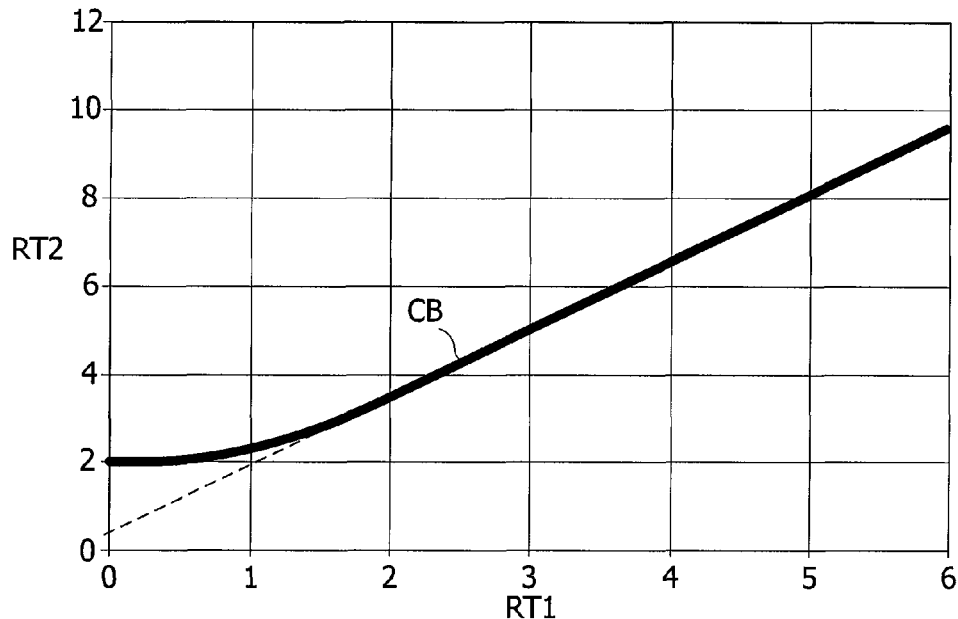
FIG. 4 shows a variation curve of a quantity relative to another, and used to perform tests of integrity of supply voltages, FIGS. 5 to 7 schematically show several circuits for analyzing the integrity of supply voltages in an integrated circuit, according to embodiments, FIG. 8 schematically shows an integrated circuit provided with supply voltage integrity analysis circuits, according to one embodiment.

FIG. 4 shows a curve CB of variations of the quantity $$RT2 = \frac{NA + NB}{NTc}$$

relative to the quantity $$RT1 = \frac{SD}{\Delta T},$$

where NA and NB are the values of the counters PCN1 and PCN2, NTc is the value of the counter BCEC, SD is the standard deviation or the square root of the variance of the convolution of the jitters of the signal observed and the reference signal, (results R1 to R19 in Tables 1 to 3), and $\Delta T$ is the difference in absolute value between the respective periods Tobs and Tref of the signal observed Obs and the reference signal Ref at the input of the circuit PIC, and which are known. The embodiments described are based on the hypothesis that the jitters observed are Gaussian jitters and therefore that the variance (or the squared standard deviation SD) of the convolution of the jitters of two signals is the sum of the jitter variances of these two signals.

It may be noted in FIG. 4 that until a value of RT1 near 1, the quantity RT2 remains constant and near the value 2 corresponding to an absence of jitter, and when the quantity RT2 is higher than 2, the quantity RT1 increases linearly according to the quantity RT2. If the straight line formed by the curve CB when the quantity RT1 is higher than 2 (straight line in dotted line) is extended towards the origin of the system of coordinates, it may be noted that this extended straight line passes near the origin of the system of coordinates (RT1 near 0 when RT2 is equal to 0). The result is that when RT2 is higher than 2, the jitter standard deviation SD is substantially proportional to the quantity RT2 multiplied by the difference |Tobs−Tref|. Thus, the test results R (results R1 to R19 of Tables 1 to 3) may be calculated as follows:

$$R = \left(\frac{NA + NB}{NTc} \cdot |Tobs - Tref|\right)^2 \quad (1)$$

A test calculator connected to the output of the circuit JEC may then be configured to perform a series of tests, each test comprising selecting the signals supplied to a circuit PC10-PC16 (see FIG. 8), waiting a certain test duration, getting the values NA, NB, NTc from the counters PCN1, PCN2 and BCEC of the measurement circuit JEC, determining the test result R from the values obtained, from the curve CB and the formula (1), and deducing by operations of matrix calculation respective jitter variances of the clock signals at the output of clock signal generation circuits, and possible links through which these clock signals have passed into the integrated circuit IC.

The clock signal generators have a known intrinsic jitter variance, linked to the technique implemented for generating the clock signal. The difference between the jitter variance of a clock signal, obtained by the tests previously described, and the intrinsic jitter variance of the clock signal generation circuit, therefore supplies a jitter variance linked to variations of the supply voltage powering the clock signal generator. Thus, by taking jitter variance measurements on clock signals at different activity levels of the integrated circuit, the ability of the supply circuits of the integrated circuit to supply constant supply voltages, and the impact of variations of the supply voltages on the clock signals may be evaluated. In addition, the jitter variances obtained allow sources of disturbances in an integrated circuit and too long links to be located.

In one embodiment, the analysis circuit PIC is controlled by command words CMD emitted by a testing device (See FIG. 8) to perform a series of tests of the circuit IC (FIG. 1), implying all the clock signals to be analyzed, and which number of tests is at least equal to the number of these signals. An example of such a series of tests is summed up in the following Table 1:

TABLE 1

| Test | Ref | Obs | Result |
|---|---|---|---|
| 1 | CK1 | CK0 | R1 = V(Ck0) + V(Ck1) |
| 2 | CK2 | CK0 | R2 = V(Ck0) + V(Ck2) |
| 3 | CK2 | CK1 | R3 = V(Ck1) + V(Ck2) |

The column "Test" of Table 1 indicates a number for each test of the series of tests. The columns "Ref" and "Obs" indicate the clock signals respectively supplied to the inputs Ref and Obs of the circuit JEC at each test of the series, and the column "Result" indicates the jitter variance values deduced from the measures supplied by the circuit JEC at each test. In a first test, the clock signals CK0 and CK1 at the output of the dividers DIV0 and DIV1 are supplied by the multiplexers MX1, MX2, MXA, MXB respectively to the inputs Obs and Ref of the circuit JEC. The result obtained R1 is proportional to the sum of the jitter variances V(CK0) and V(CK1) of the clock signals CK0, CK1. Likewise, in a second test, the clock signals CK0 and CK2 at the output of the dividers DIV0 and DIV2 are supplied by the multiplexers MX1, MX2, MXA, MXB to the inputs Obs and Ref of the circuit JEC. The result obtained R2 is proportional to the sum of the jitter variances V(CK0) and V(CK2) of the clock signals CK0, CK2. In a third test, the clock signals CK1 and CK2 at the output of the dividers DIV1 and DIV2 are supplied by the multiplexers MX1, MX2, MXA, MXB to the inputs Obs and Ref of the circuit JEC. The result obtained R3 is proportional to the sum of the jitter variances V(CK1) and V(CK2) of the clock signals CK1, CK2.

The series of three tests mentioned in Table 1 therefore allows a system of three equations with three unknown values CK0, CK1, CK2 to be obtained. By a conventional matrix calculation, the jitter variance V(CK0), V(CK1), V(CK2) of each clock signal CK1, CK2, CK3 may be determined independently from the jitter variances of the other clock signals, as follows:

$$V(CK0)=(R1+R2-R3)/2 \quad (2)$$

$$V(CK1)=(R1+R3-R2)/2 \quad (3)$$

$$V(CK1)=(R2+R3-R1)/2 \quad (4)$$

Figure 5:
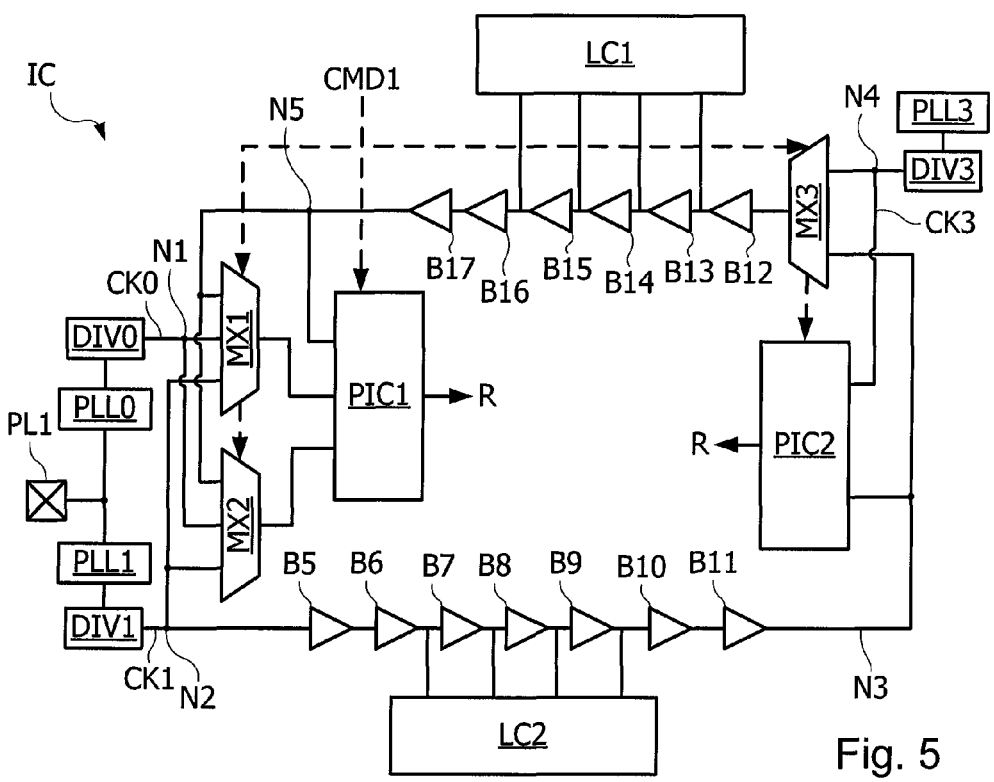

FIG. 5 shows a part of the integrated circuit IC comprising the connection pad PL1 connected to the clock signal generation circuits PLL0 and PLL1, the frequency dividers DIV0, DIV1 connected at the output of the circuits PLL0, PLL1, the multiplexers MX1, MX2, and another clock signal generation circuit PLL3 connected to a frequency divider DIV3. Inputs of each multiplexer MX1, MX2 are connected respectively to a node N1 at the output of the divider DIV0 and a node N2 at the output of the divider DIV1. The integrated circuit IC also comprises a multiplexer MX3 comprising an input connected to a node N4 at an output of the divider DIV3, and an input connected to a node N3 linked to the node N2, through transfer gates B5, B6, B7, B8, B9, B10 and B11. The output of the multiplexer MX3 is linked to a node N5 through transfer gates B12, B13, B14, B15, B16 and B17, the node N5 being connected to an input of the multiplexers MX1 and MX2.

According to one embodiment, the integrated circuit IC also comprises two supply voltage integrity analysis circuits PIC1, PIC2 which may, for example, be identical to the circuit PIC shown in FIG. 2. The node N5 is linked to a clock signal input of the circuit PIC1. A clock signal input of the circuit PIC2 is connected to the node N4 at the output of the divider DIV3. Another clock signal input of the circuit PIC2 is connected to the node N3. The transfer gates B5 to B17 are provided in the circuit to compensate propagation times of the signals through the various links of the circuit and rectify the edges in the clock signals. The gates B6 to B9 also allow a clock tree to be generated for a logic circuit LC2 of the integrated circuit IC. Likewise, the gates B12 to B15 allow a clock tree to be generated for another logic circuit LC1 of the integrated circuit IC.

The circuit PIC2 may thus receive the signal CK3 and the signal passing through the node N3 and corresponding to the signal CK1 transmitted through the gates B5 to B12. The circuit PIC1 may receive the clock signals CK0 and CK1, as well as the signal circulating at the node N5 and corresponding either to the signal CK3, or to the signal CK1 which has passed through the nodes N2 and N3.

The multiplexers MX1 to MX3, MXA and MXB (see FIG. 2) are controlled by a command word CMD1 emitted by a testing device (not shown in FIG. 5) to select taking nodes N1 to N5 for taking clock signals CK0, CK1, CK3 to be respectively linked to the input Ref and the input Obs of the circuits PIC1 and PIC2.

In one embodiment, the circuits PIC1, PIC2 are controlled to perform a series of tests such as that summed up in the following Table 2:

TABLE 2

| Test | Analysis circuit | Ref | Obs | Link | Result |
|---|---|---|---|---|---|
| 1 | PIC1 | CK1 | CK0 |  | R4 = V(Ck0) + V(Ck1) |
| 2 | PIC1 | CK3 | CK0 | N4-N5/ | R5 = V(Ck0) + V(Ck3) + V(N5) |
| 3 | PIC1 | CK3 | CK1 | N4-N5/ | R6 = V(Ck1) + V(Ck3) + V(N5) |
| 4 | PIC2 | CK1 | CK3 | N2-N3/ | R7 = V(Ck1) + V(Ck3) + V(N3) |
| 5 | PIC1 | CK1 | CK0 | N2-N3-N4-N5/ | R8 = V(Ck0) + V(Ck1) + V(N3) + V(N5) |

The column "Test" of Table 2 indicates a number of each test of the series of tests. The column "Analysis circuit" indicates the analysis circuit PIC1, PIC2 implemented to perform each test. The columns "Ref" and "Obs" indicate the clock signals respectively supplied to the inputs Ref and Obs of the circuit JEC of the analysis circuit PIC1, PIC2 indicated in the column "Analysis circuit", at each test. The column "Link" indicates if need be through which links the signals mentioned in the columns Ref and Obs have passed, and the column "Result" indicates the value obtained from the measure supplied by the circuit PIC1 or PIC2 indicated in the column "Analysis circuit".

In a first test, the clock signals CK0 and CK1 at the nodes N1 and N2 are directly supplied to the inputs Obs and Ref of the circuit PIC1, by the multiplexers MX1, and MX2, and the multiplexers MXA, MXB of the circuit PIC 1. The result obtained R4 is proportional to the sum of the jitter variances V(CK0) and V(CK1) of the clock signals CK0, CK1. In a second test, the multiplexers MX1 to MX3, and the multiplexers MXA, MXB of the circuit PIC1 are controlled to supply to the inputs Obs and Ref of the circuit JEC of the circuit PIC1, the clock signal CK0 at the node N1 and the clock signal CK3 at the node N5. The signal at the node N5 therefore corresponds to the signal CK3 after being transmitted by the link between the nodes N4 and N5. It is then considered that the jitter variance of the signal at the node N5, obtained from the measure supplied by the circuit PIC1 is substantially equal to the sum of the jitter variance V(CK3) of the signal CK3 at the node N4 at the output of the divider DIV3, and the jitter variance introduced by the link between the nodes N4 and N5, noted V(N5). The result obtained R5 is thus proportional to the sum of the jitter variances V(CK0), V(CK3) and V(N5) of the clock signals CK0 and CK3 and the link between the nodes N4 and N5. In a third test, the multiplexers MX1 to MX3, and the multiplexers MXA, MXB of the circuit PIC1 are controlled to supply the clock signal CK1 at the node N2 and the clock signal CK3 at the node N5 to the inputs Obs and Ref of the circuit JEC of the circuit PIC1. The result obtained R6 is therefore proportional to the sum of the jitter variances V(CK1), V(CK3) and V(N5). In a fourth test, the multiplexers MXA and MXB of the circuit PIC2 are controlled to supply the clock signal CK1 at the node N3 and the clock signal CK3 at the node N4 to the inputs Obs and Ref of the circuit JEC of the circuit PIC2. In this test, it is considered that the jitter variance of the signal at the node N3 is substantially equal to the sum of the jitter variance V(CK1) of the signal CK1 and the jitter variance introduced by the link between the nodes N2 and N3, noted V(N3). The result obtained R7 is therefore substantially proportional to the sum of the jitter variances V(CK1), V(N3) and V(CK3). Finally, in a fifth test, the multiplexers MX1 to MX3, and the multiplexers MXA, MXB of the circuit PIC1 are controlled to supply to the inputs Obs and Ref of the circuit JEC of the circuit PIC1, the clock signal CK0 at the output of the divider DIV0 and the signal CK1 at the node N5 and which has passed by the nodes N2 and N3. The jitter variance of the signal at the node N5 is therefore equal to the sum of the jitter variance V(CK1) of the signal CK1 and the jitter variance V(N3) introduced by the link between the nodes N2 and N3, and the jitter variance introduced by the link between the nodes N3 and N5 which is substantially equal, in first approximation, to the jitter variance of the link between the nodes N4 and N5, i.e., V(N5). The result obtained R8 is therefore proportional to the sum of the jitter variances V(CK0), V(CK1), V(N3) and V(N5).

The series of five tests mentioned in Table 2 allows a system of five equations with five unknown values V(CK0), V(CK1), V(CK3), V(N3), V(N5) to be obtained. Resolving this equation system makes it possible to obtain independently, the respective jitter variances of the signals CK0, CK1, CK3 and those introduced by the link between the nodes N2 and N3, and by the link between the node N3 or N4 and the node N5, as follows:

$$V(CK0) = (R4 + R5 - R6)/2 \tag{5}$$

$$V(CK1) = (R4 + R6 - R5)/2 \tag{6}$$

$$V(CK3) = (R5 + R7 - R8)/2 \tag{7}$$

$$V(N3) = (R7 + R8 - R4 - R6)/2 \tag{8}$$

$$V(N5) = (R6 + R8 - R4 - R7)/2 \tag{9}$$

It is to be noted that other measures of jitter variance, i.e., other combinations of signals supplied to the input of one or the other circuit PIC1, PIC2, may be considered to obtain a neighboring or identical result. The choice of the signals supplied to the inputs of the circuits PIC1, PIC2 at each test are selected to obtain an equation system having a single solution. It is also to be noted that certain tests implying different analysis circuits PIC1, PIC2 and different links, may be performed in parallel, such as the tests 1 and 4 of Table 2.

Figure 6:
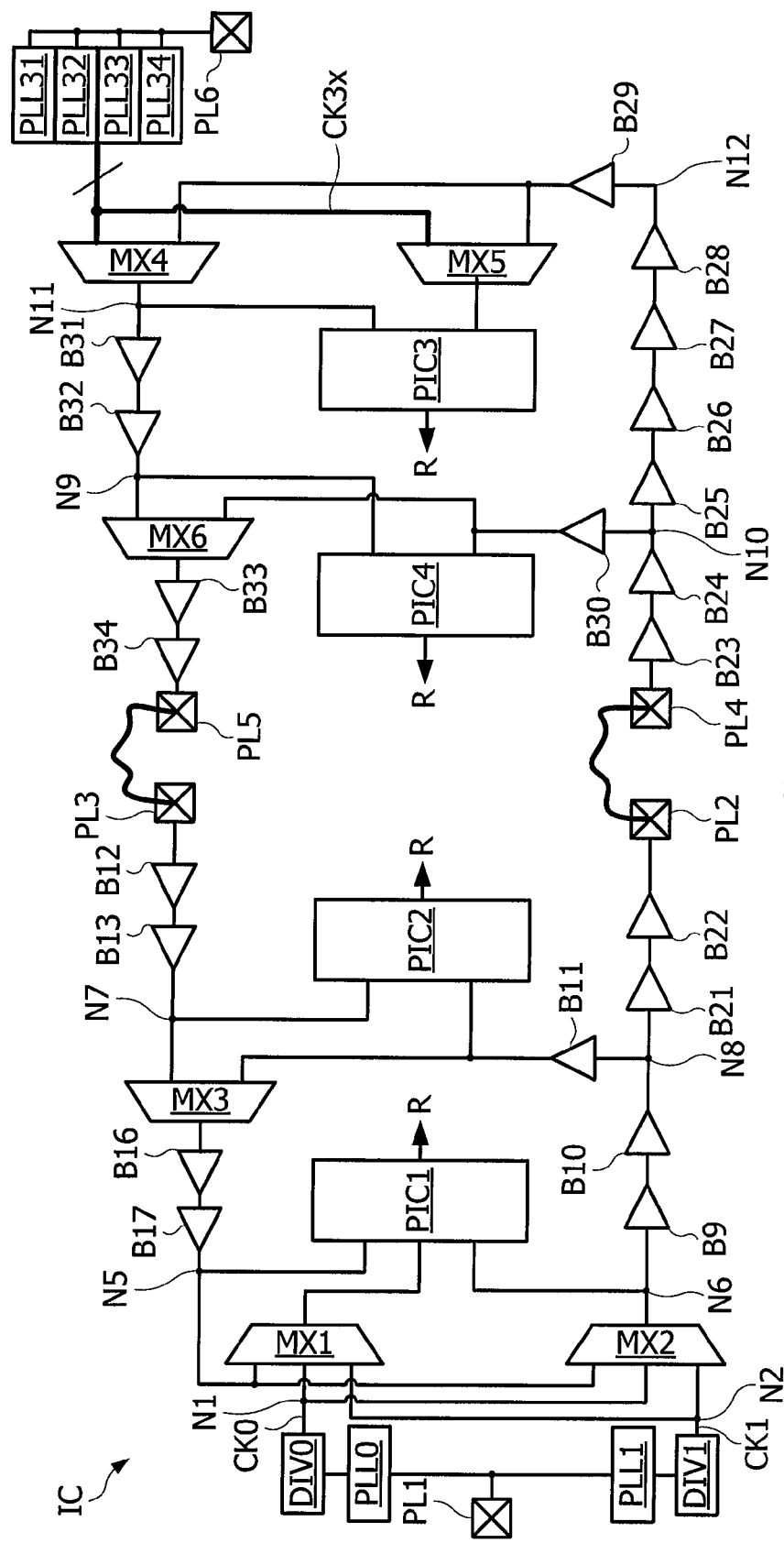

FIG. 6 shows an integrated circuit IC comprising a first part comprising the two supply voltage integrity analysis circuits PIC1, PIC2, and a second part comprising two other supply voltage integrity analysis circuits PIC3 and PIC4, according to another embodiment. In FIG. 6, the first part of the integrated circuit IC comprises two connection pads PL2, PL3 which are connected for testing by wires with two connection pads PL4, PL5 of the second part of the integrated circuit. The first part of integrated circuit IC comprises the connection pad PL1 connected to the clock signal generation circuits PLL0 and PLL1, the circuits PLL0, PLL1 being connected to the frequency dividers DIV0, DIV1. The first part of integrated circuit IC also comprises the multiplexers MX1, MX2, MX3 The output of the multiplexer MX3 is connected to the node N5 through the transfer gates B16 and B17, the node N5 being connected to an input of the multiplexers MX1 and MX2, as well as an input of the circuit PIC2. The output of the multiplexer MX2 is connected to a node N6, the node N6 being connected to an input of the circuit PIC1 and linked to the connection pad PL2 through the transfer gates B9, B10, B21 and B22. The output of the gate B10 is connected to a node N8 linked to an input of the circuit PIC2 through the gate B11. An input of the circuit PIC2 is connected to a node N7 connected to an input of the multiplexer MX3, and linked to a connection pad PL3 of the integrated circuit IC through the gates B12 and B13.

The second part of the integrated circuit IC comprises multiplexers MX4, MX5, MX6 and clock signal generation circuits PLL31, PLL32, PLL33, PLL34 connected in input to a connection pad PL6. Each output of the circuits PLL31, PLL32, PLL33, PLL34 is connected to a respective input of each multiplexer MX4, MX5. The connection pad PL4 is linked to a node N12 in input of the multiplexers MX4 and MX5, through transfer gates B23, B24, B25, B26, B27, B28, B29. The output of the multiplexer MX4 is connected to a node N11 linked to a node N9 in input of the multiplexer MX6, through transfer gates B30 and B31. The output of the multiplexer MX6 is connected to the connection pad PL5 through transfer gates B33, B34. Inputs of the circuit PIC3 are connected to the outputs of the multiplexers MX4 and MX5. The node N9 is linked to an input of the circuit PIC4. The link between the gates B24 and B25 comprises a node N10 linked through a transfer gate B30, to an input of the circuit PIC4 and an input of the multiplexer MX6.

The multiplexers MX1 to MX6, and the circuits PIC1 to PIC4 are controlled by a command word emitted by a testing device (not shown) to select the signals to be respectively applied to the input Ref and the input Obs of the circuits JEC of the circuits PIC1 to PIC4. In one embodiment, the analysis circuits PIC1-PIC4 are controlled to perform a series of tests such as that summed up in the following Table 3:

TABLE 3

| Test | Analysis circuit | Ref | Obs | Link | Result measured |
|---|---|---|---|---|---|
| 1 | PIC1 | CK1 | CK0 | | R11 = V(Ck0) + V(Ck1) |
| 2 | PIC1 | CK1 | CK0 | N6-N8-N5 | R12 = V(Ck0) + V(Ck1) + V(N8) + V(N5) |
| 3 | PIC1 | CK1 | CK0 | N6-N8-N10-N7-N5 | R13 = V(Ck0) + V(Ck1) + V(N8) + V(N10) + V(N7) + V(N5) |
| 4 | PIC1 | CK1 | CK0 | N6-N8-N10-N12-N9-N7-N5 | R14 = V(Ck0) + V(Ck1) + V(N8) + V(N10) + V(N12) + V(N9) + V(N7) + V(N5) |
| 5 | PIC1 | CK1 | CK3x | /N11-N9-N7-N5 | R15 = V(Ck1) + V(Ck3x) + V(N9) + V(N7) + V(N5) |
| 6 | PIC2 | CK1 | CK3x | N6-N8/N11-N9-N7 | R16 = V(Ck1) + V(Ck3x) + V(N8) + V(N9) + V(N7) |
| 7 | PIC4 | CK1 | CK3x | N6-N8-N10/N1-N9 | R17 = V(Ck1) + V(Ck3x) + V(N8) + V(N10) + V(N9) |
| 8 | PIC3 | CK1 | CK3x | N6-N8-N10-N12/ | R18 = V(Ck1) + V(Ck3x) + V(N8) + V(N10) + V(N12) |
| 9 | PIC3 | CK0 | CK3x | N6-N8-N10-N12/ | R19 = V(Ck0) + V(Ck3x) + V(N8) + V(N10) + V(N12) |

The column "Test" of Table 3 indicates a number for each test of the series of tests. The column "Analysis circuit" indicates the analysis circuit PIC1-PIC4, implemented to perform each test. The columns "Ref" and "Obs" indicate the clock signals respectively supplied to the inputs Ref and Obs of the circuit JEC of the circuits PIC1, PIC2, PIC3, PIC4 indicated in the column "Analysis circuit". The column "Link" indicates if need be through which links the signals mentioned in the columns "Ref" and "Obs" have passed, and the column "Result" indicates the value R<i> obtained from the measure supplied by the circuit PIC1-PIC4 indicated in the column "Analysis circuit".

In a first test of the series of tests, the clock signals CK0 and CK1 at the output of the dividers DIV0 and DIV1 are directly supplied by the multiplexers MX1 and MX2 respectively to the inputs Obs and Ref of the circuit JEC in the circuit PIC1. The result obtained R11 is proportional to the sum of the jitter variances V(CK0) and V(CK1) of the clock signals CK0, CK1. In a second test, the multiplexers MX1 to MX3 are controlled to supply to the inputs Obs and Ref of the circuit JEC of the circuit PIC1, the clock signals CK0 and CK1 at the output of the dividers DIV0 and DIV1, directly or successively through the link between the nodes N6 and N8, and the direct link between the nodes N8 and N5 (passing through the gate B11). The result obtained R12 is therefore proportional to the sum of the jitter variances V(CK0), V(CK1), and the jitter variances V(N8), V(N5) introduced by the links N6-N8 and N8-N5. In a third test, the multiplexers MX1 to MX3 and MX6 are controlled to supply to the inputs Obs and Ref of the circuit JEC of the circuit PIC1, the clock signals CK0 and CK1 directly or successively through the links between the nodes N6 and N8, between the nodes N8 and N10, between the nodes N10 and N7 (passing through the gate B30), and between the nodes N7 and N5. The result obtained R13 is proportional to the sum of the jitter variances V(CK0), V(CK1), V(N8), and the jitter variances V(N10), V(N7) and V(N5), introduced by the link between the nodes N8 and N10, by the direct link between the nodes N10 and N7 (via the gate B30) and by the link between the nodes N7 and N5. In this test, it is considered that the jitter variance introduced by the link between the nodes N7 and N5 is substantially equal to the jitter variance V(N5) introduced by the direct link (passing through the gate B11) between the nodes N8 and N5. In a fourth test, the multiplexers MX1 to MX3, MX4 and MX6 are controlled to supply to the inputs Obs and Ref of the circuit JEC of the circuit PIC1, the clock signals CK0 and CK1 directly or successively through the nodes N6, N8, N10, N12, N9, N7 and N5. The result obtained R14 is proportional to the sum of the jitter variances V(CK0), V(CK1), V(N8), V(N10), V(N5), and the jitter variances V(N12) and V(N9) introduced by the links between the nodes N10 and N12, and between the nodes N12 and N9. In this test, it is considered that the jitter variance introduced by the link between the nodes N12 and N9 is substantially equal to the jitter variance of the link between the nodes N11 and N9. In a fifth test, the multiplexers MX2 to MX4 and MX6 are controlled to supply to the inputs Obs and Ref of the circuit JEC of the circuit PIC1, directly the clock signal CK1, and one of the clock signals CK3x successively through the nodes N11, N9, N7, and N5. The result obtained R15 is proportional to the sum of the jitter variances V(CK1), V(CK3x), V(N5), V(N7) and V(N9). In a sixth test, the multiplexers MX2, MX4 and MX6 are controlled to supply to the inputs Obs and Ref of the circuit JEC of the circuit PIC2, the clock signal CK1 through the nodes N6 and N8, and one of the clock signals CK3x successively through the nodes N11, N9 and N7. The result obtained R16 is proportional to the sum of the jitter variances V(CK1), V(CK3x), V(N8), V(N9) and V(N7). In a seventh test, the multiplexers MX2 and MX4 are controlled to supply to the inputs Obs and Ref of the circuit JEC of the circuit PIC4, the clock signal CK1 successively through the nodes N6, N8 and N10, and one of the clock signals CK3x through the nodes N11 and N9. The result obtained R17 is proportional to the sum of the jitter variances V(CK1), V(CK3x), V(N8), V(N10) and V(N9). In an eighth test, the multiplexers MX2, MX4, and MX5 are controlled to supply to the inputs Obs and Ref of the circuit JEC of the circuit PIC3 the clock signal CK1 successively through the nodes N6, N8, N10 and N12, and directly one of the clock signals CK3x. The result obtained R18 is proportional to the sum of the jitter variances V(CK1), V(CK3x), V(N8), V(N10) and V(N12). Finally, in a ninth test, the multiplexers MX2, MX4, and MX5 are controlled to supply to the inputs Obs and Ref of the circuit JEC of the circuit PIC3, the clock signal CK0 successively through the nodes N6, N8, N10 and N12, and directly one of the clock signals CK3x. The result obtained R19 is proportional to the sum of the jitter variances V(CK0), V(CK3x), V(N8), V(N10) and V(N12).

The nine tests mentioned in Table 3 therefore make it possible to obtain a system of nine equations with nine unknown values V(CK0), V(CK1), (CK3x), V(N5), V(N7), V(N8), V(N9), V(N10), V(N12), which resolution makes it possible to independently obtain the respective jitter variances of the signals CK0, CK1, CK3x, and those introduced by the link between the nodes N8 and N10, the link between the nodes N8 or N7 and N5, the link between the nodes N8 and N10, the link between the nodes N10 or N9 and N7, the link between the nodes N10 and N12, and the link between the nodes N12 or N11 and N9, as follows:

$$V(CK0)=(R11+R19-R18)/2 \quad (10)$$

$$V(CK1)=(R11+R18-R19)/2 \quad (11)$$

$$V(CK3x)=(R15+R19-R14)/2 \quad (12)$$

$$V(N5)=(R12+R15-R11-R16)/2 \quad (13)$$

$$V(N7)=(R13+R16-R12-R17)/2 \quad (14)$$

$$V(N8)=(R12+R16-R11-R15)/2 \quad (15)$$

$$V(N9)=(R14+R17-R13-R18)/2 \quad (16)$$

$$V(N10)=(R13+R17-R12-R16)/2 \quad (17)$$

$$V(N12)=(R14+R18-R13-R17)/2 \quad (18)$$

Given that each test supplies at the minimum the sum of two variances, the number of nodes for taking a signal which variance is to be determined is superior or equal to three, and the number of tests of a series is also superior or equal to three. There may be three nodes through which passes a same signal or through which pass two or three different signals.

Figure 7:
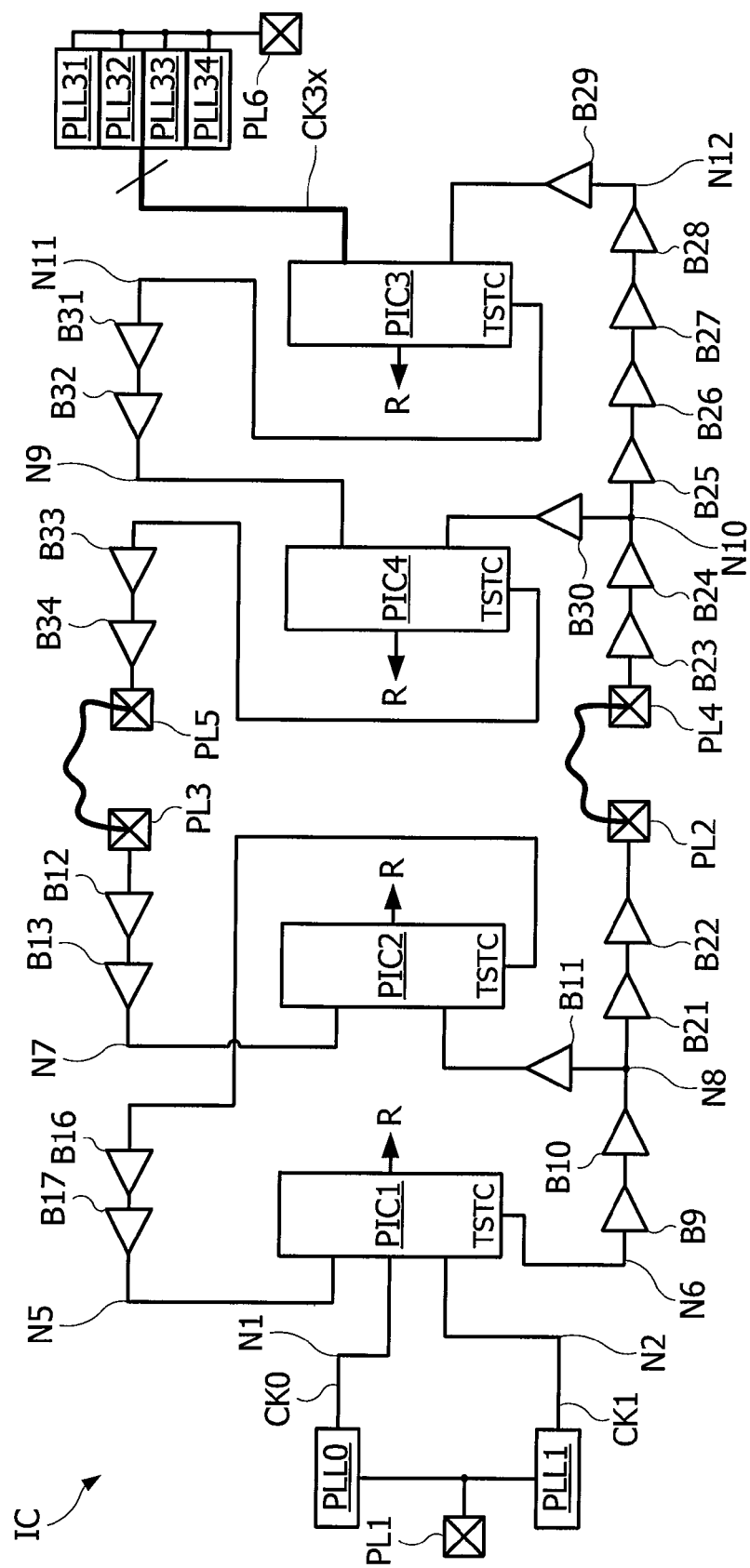

If it is provided in the circuit PIC, as shown in FIG. 2, an additional interconnection output TSTC linked to the output of one of the dividers DIVA, DIVB, the testing circuit shown in FIG. 6 may be simplified as shown in FIG. 7. In FIG. 7, the dividers DIV1, DIV2 are suppressed from the testing circuit because they may be replaced by the dividers DIVA, DIVB of the circuits PIC1 to PIC4. Likewise, the multiplexers MX1 to MX6 are suppressed from the testing circuit because they may be replaced by the multiplexers MXA, MXB of the circuits PIC1 to PIC4. To that end, the outputs of the clock circuits PLL0 and PLL1 are connected to inputs of the circuit PIC1. The node N6 is linked to the output TSTC of the circuit PIC1. The output of the gate B17 is linked to an input of the circuit PIC1. The output of the gate B11 and the node N7 are linked to inputs of the circuit PIC2. The output TSTC of the circuit PIC2 is connected to the input of the gate B16. The output of the gate B30 and the node N9 are linked to inputs of the circuit PIC4. The output TSTC of the circuit PIC4 is connected to the input of the gate B33. The output of the gate B29 and the outputs of the clock circuits PLL31-PLL34 are linked to inputs of the circuit PIC3. The output TSTC of the circuit PIC3 is connected to the node N11 at the input of the gate B31. The tests indicated in Table 1, for example, may be performed by controlling adequately the circuits PIC1 to PIC4.

Figure 8:
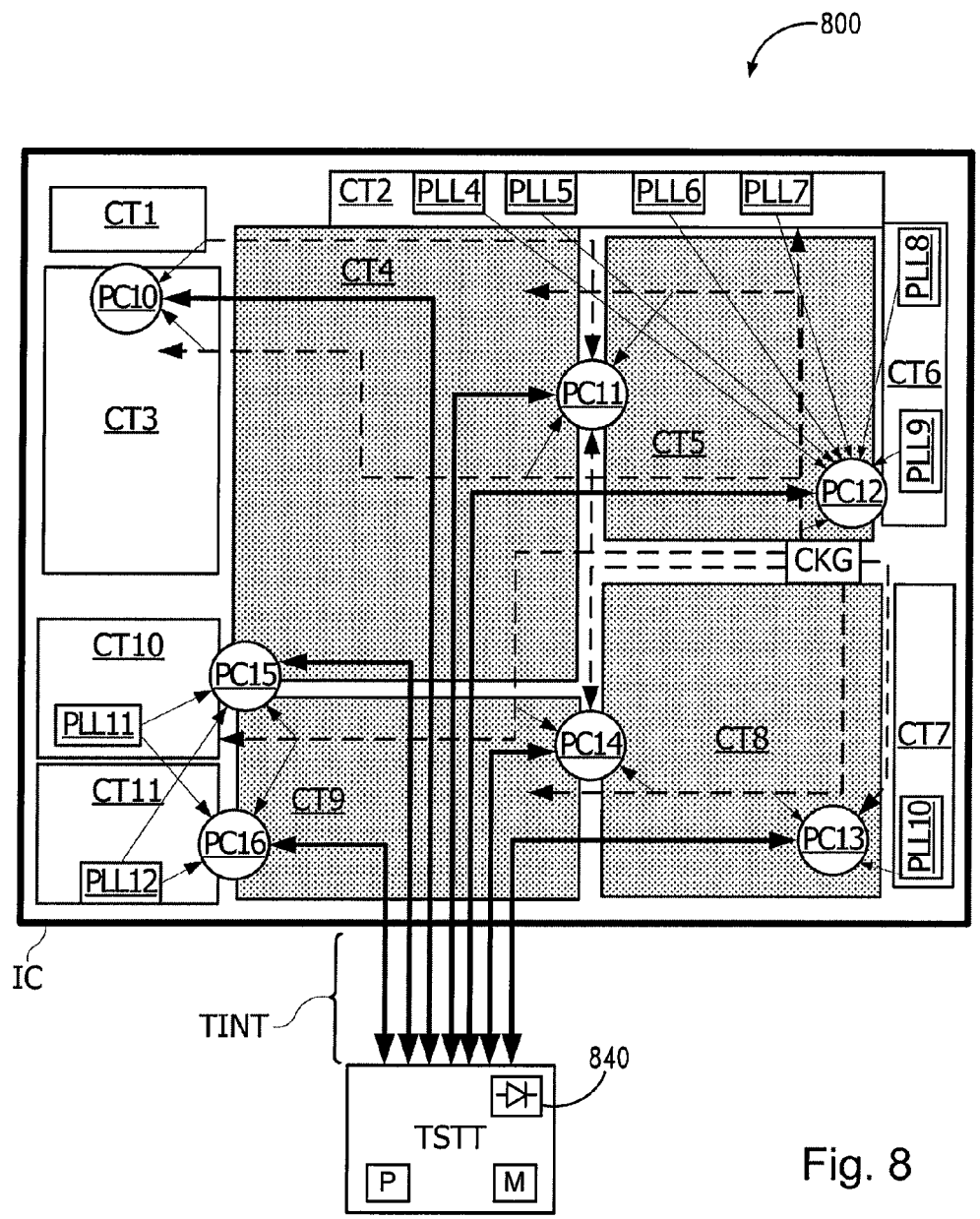

FIG. 8 shows a system 800 including the integrated circuit IC comprising several blocks of circuit CT1 to CT11, as well as a main clock signal generation circuit CKG. The block CT2 comprises four clock signal generation circuits PLL4 to PLL7. The block CT6 comprises two clock signal generation circuits PLL8, PLL9. Each block CT7, CT10 and CT11 comprises a clock signal generation circuit PLL10, PLL11, PLL12.

According to one embodiment, the integrated circuit IC also comprises several supply voltage integrity analysis circuits PC10 to PC16, which may be similar to the circuit PIC shown in FIG. 2. The circuits PC10-PC16 may be arranged between the blocks of circuits CT1 to CT11, to analyze the integrity of the supply voltages supplied to these blocks CT1 to CT11. Thus, the circuit PC10 is arranged between the blocks CT1 and CT2, and receives a clock signal of the block CT1 and a clock signal of the block CT3, coming from the circuit CKG. The circuit PC11 is arranged between the blocks CT4 and CT5, and receives clock signals generated by the blocks CT1 and the circuit CKG, and clock signals of the circuits CT5 and CT3, coming from the circuit CKG. The circuit PC12 is arranged between the blocks CT5 and CT6 and near the circuit CKG, and receives clock signals generated by the circuits PLL4 to PLL9, as well as a clock signal coming from the circuit CKG for the circuits CT2, CT3 and CT4. The circuit PC13 is arranged between the blocks CT7 and CT8, and receives clock signals generated by the circuits CKG and PLL10, and a clock signal from the circuit CT9 coming from the circuit CKG. The circuit PC14 is arranged between the blocks CT8 and CT9, and receives clock signals generated by the circuit CKG, and clock signals from the circuits CT9 and CT10, coming from the circuit CKG. The circuit PC15 is arranged between the blocks CT4, CT9 and CT10. The circuit PC16 is arranged between the blocks CT9 and CT11. The circuits PC15 and PC16 receive clock signals generated by the circuits PLL11 and PLL12, and a clock signal of the circuit CT9, coming from the circuit CKG. The circuits PC10-PC16 are connected to a testing device TSTT through a connection interface TINT, to take measurements such as those described in Tables 1 to 3. The device TSTT is configured to control multiplexers so as to select the signals supplied to the inputs Ref and Obs of the jitter measurement circuits JEC of the circuits PC10 to PC16, at each test of a set of tests, to collect the values measured, to deduce from the measured values the jitter variances of the signals supplied to the circuits JEC, and to determine from these jitter variances the jitter variances of signals at the output of clock signal generation circuits and links in the integrated circuit IC. As illustrated, the testing device TSTT comprises a processor P, a memory M and discrete circuit 840 configured to perform the described functions of the testing device TSTT, for example, to generate control signals to control the testing of the integrated circuit and to analyse signals received from the integrated circuit.

It will be clear to those skilled in the art that the present disclosure is susceptible of various embodiments and applications. In particular, the disclosure is not limited to the jitter measurement method described with reference to FIG. 3. Other jitter measurement methods such as that described in the patent application US2007/002994 may be implemented within the range of the present disclosure, leading to other relationships between the jitter variance or standard deviation and the jitter measures obtained. The result is that the equation (1) is not necessarily used, because it depends on the jitter measurement implemented.

Some embodiments may take the form of or comprise computer program products. For example, according to one embodiment there is provided a computer readable medium comprising a computer program adapted to perform one or more of the methods or functions described above. The medium may be a non-transitory medium such as a physical storage medium, for example, a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., programmed by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
selecting a series of at least three tests of an integrated circuit;
performing, using the integrated circuit, the selected series of at least three tests on the integrated circuit, each test comprising:
selecting two nodes among at least three taking nodes for taking clock signals, from the integrated circuit;
taking two clock signals at the two selected taking nodes during a test duration;
detecting and counting events appearing in a jitter signal between the two clock signals taken, during the test duration; and
determining from numbers of events counted, a test result proportional to a sum of jitter variances of the two clock signals taken during the test duration, wherein a set of two nodes selected during one of the series of tests is different from a set of two nodes selected during another one of the series of tests; and
determining, using the at least one processing device of the integrated circuit, a jitter variance of each clock signal taken during the series of tests using a matrix calculation based on the results of the series of tests.

2. The method of claim 1 wherein the jitter variance of a clock signal taken at a node at a distance from an output of a generation circuit for generating the clock signal, is equal to a jitter variance of the clock signal at the output of the circuit for generating the clock signal taken, plus a jitter variance introduced by a link transmitting the clock signal between the output of the generation circuit and the node for taking the clock signal, the method comprising determining the jitter variance of the clock signal at the output of the clock signal generation circuit, and the jitter variance introduced by the link between the output of the clock signal generation circuit and the node for taking the clock signal taken, wherein selecting a series of tests comprises determining a number of tests of the series of tests and the signals taken at each test of the series of tests so as to be able to determine by the matrix calculation the jitter variance of each clock signal at the output of the generation circuit thereof and the jitter variance of each link between a selected point for taking a clock signal and the output of the clock signal generation circuit.

3. The method of claim 1 wherein performing the series of tests comprises taking a sample of a first out of the two taken signals at each period of a second of the taken signals, and storing the samples taken, the events counted comprising events of apparition of a particular pattern or matching a particular mask, in the stored samples, and events of phase matching between the two taken signals.

4. The method of claim 3 wherein the test result of each test of the series of tests is obtained by a following formula:

$$R = \left(\frac{NA + NB}{NTc} \cdot |Tobs - Tref|\right)^2$$

where R is the result of the test, NA and NB are the values of two counters of apparition of a particular pattern in the stored samples or matching the stored samples with a particular mask, NTc is the value of a counter incremented each time the two taken signals are detected in phase, and Tobs and Tref are periods of the two taken signals.

5. The method of claim 1, comprising providing in the integrated circuit at least one circuit for analyzing supply voltage integrity comprising a jitter measurement circuit and multiplexers allowing clock signals to be taken and taking nodes for taking clock signals to be selected.

6. The method of claim 1, comprising providing in the integrated circuit a plurality of supply voltage integrity analysis circuits, each comprising a jitter measurement circuit and multiplexers allowing clock signals to be taken and clock signal taking nodes to be selected, the supply voltage integrity analysis circuits being located on the integrated circuit between blocks of the integrated circuit or near sources of clock signals.

7. The method of claim 1, comprising performing the series of tests in various operating conditions of the integrated circuit, comparing jitter variances obtained at each series of tests, and deducing therefrom information relating to an integrity of supply voltages.

8. The method of claim 1 wherein the at least one processing device comprises a processing block of the integrated circuit.

9. The method of claim 1 wherein each of the at least three taking nodes is selected for at least one of the series of tests.

10. An integrated circuit, comprising:
at least one clock generator configured to generate a clock signal;
at least three clock signal taking nodes; and
analysis logic configured to:
receive test control signals of a test of the integrated circuit;
select, based on the test control signals, two clock signal taking nodes among the at least three taking nodes, wherein the analysis logic includes one or more multiplexers coupled to the at least three clock signal taking nodes and configured to select the two clock signal taking nodes based on the test control signals;
take two clock signals at the two selected clock signal taking nodes during a test duration; and
detect and count events appearing in a jitter signal between the two clock signals taken, during the test duration.

11. The integrated circuit of claim 10 wherein the analysis logic comprises a jitter measurement block.

12. The integrated circuit of claim 10 wherein the analysis logic comprises a plurality of supply voltage integrity analysis logic blocks, each supply voltage integrity analysis logic block comprising a jitter measurement circuit and multiplexers configured to select clock signal taking nodes, the respective supply voltage integrity analysis logic blocks located on the integrated circuit between functional blocks of the integrated circuit or near sources of clock signals.

13. The integrated circuit of claim 10, further comprising:
an interface configured to couple the analysis logic to a testing device, wherein the interface is configured to provide test control signals generated by the testing device to the analysis logic and to provide numbers of events counted by analysis logic to the testing device.

14. A testing device, comprising:
a connection interface configured to couple to an integrated circuit; and
testing logic coupled to the connection interface and configured to:
perform a series of at least three tests, each test comprising:
generating test control signals to control selection by the integrated circuit, of two nodes among at least three clock signal taking nodes;
generating test control signals to control taking by the integrated circuit of two clock signals at the two selected taking nodes, during a test duration, and detecting and counting by the integrated circuit of events appearing in a jitter signal between the two taken clock signals, during the test duration; and
determining from numbers of events counted a test result proportional to a sum of jitter variances of the two clock signals taken, wherein each of the at least three clock signal taking nodes is selected for at least one of the tests of the series of at least three tests; and
determine a jitter variance of each clock signal taken during the series of tests using a matrix calculation based on the determined test results of the series of tests.

15. The testing device of claim 14 wherein the jitter variance of a clock signal taken at a node at a distance from an output of a clock signal generation circuit, is equal to a jitter variance of the clock signal at the output of the generation circuit of the clock signal taken, plus a jitter variance introduced by a link transmitting the clock signal between the output of the generation circuit and the clock signal taking node, wherein the testing device is configured to determine the jitter variance of the clock signal at the output of the clock signal generation circuit, and the jitter variance introduced by the link between the output of the clock signal generation circuit and the node for taking the clock signal taken, wherein the number of tests of the series of tests and the signals taken at each test of the series of tests are selected so as to be able to determine by a matrix calculation the jitter variance of each clock signal at the output of the generation circuit thereof and the jitter variance of each link between a selected point for taking a clock signal and the output of the clock signal generation circuit.

16. The testing device of claim 14 wherein the testing logic is configured to calculate a result of each of the tests of the series of tests using a following formula:

$$R = \left(\frac{NA + NB}{NTc} \cdot |Tobs - Tref|\right)^2$$

where R is the result of the test, NA and NB are values of two counters of apparition of a particular pattern in stored samples or matching the stored samples with a particular mask, NTc is a value of a counter incremented each time the two taken signals are detected in phase, and Tobs and Tref are periods of the two taken signals.

17. The testing device of claim 14 wherein the testing logic is configured to perform the series of tests in various operating conditions of the integrated circuit, and comparing the jitter variances obtained at each series of test.

18. A system, comprising:
an integrated circuit, having:
at least one clock signal generator;
at least three clock signal taking nodes; and
supply voltage integrity analysis logic including:
a multiplexer coupled to the at least three clock signal taking nodes and configured to select, based on received test control signals, two clock signal taking nodes among the at least three taking nodes; and
a jitter measurement block configured to detect and count events appearing in a jitter signal between the two clock signals selected by the multiplexer during the test duration; and
a testing device configured to generate the test control signals and to receive numbers of events counted by the supply voltage integrity analysis logic.

19. The system of claim 18 wherein the supply voltage integrity analysis logic comprises a plurality of supply voltage integrity analysis logic blocks, each supply voltage integrity analysis logic block comprising a jitter measurement circuit and multiplexers configured to select clock signal taking nodes, the respective supply voltage integrity analysis logic blocks located on the integrated circuit between functional blocks of the integrated circuit or near sources of clock signals.

20. The system of claim 18, further comprising:
an interface configured to couple the integrated circuit to the testing device, wherein the interface is configured to provide test control signals generated by the testing device to the supply voltage integrity analysis logic and to provide numbers of events counted by supply voltage integrity analysis logic to the testing device.

21. The system of claim 18 wherein the testing device comprises testing logic configured to generate test control signals for a series of tests and determine a jitter variance of each clock signal taken during the series of tests using a matrix calculation based on the received numbers of events.

22. A non-transitory computer-readable medium whose contents cause at least one processing device to perform a method, the method comprising:
selecting a series of at least three tests of an integrated circuit;
performing the selected series of at least three tests on the integrated circuit, each test comprising:
selecting two nodes among at least three taking nodes for taking clock signals, from the integrated circuit;
taking two clock signals at the two selected taking nodes during a test duration;
detecting and counting events appearing in a jitter signal between the two clock signals taken, during the test duration; and
determining from numbers of events counted, a test result proportional to a sum of jitter variances of the two clock signals taken during the test duration, wherein each of the at least three clock signal taking nodes is selected for at least one of the tests of the series of at least three tests; and
determining a jitter variance of each clock signal taken during the series of tests using a matrix calculation based on the results of the series of tests.

23. The non-transitory computer readable medium of claim 22 wherein the jitter variance of a clock signal taken at a node at a distance from an output of a generation circuit for generating the clock signal, is equal to a jitter variance of the clock signal at the output of the circuit for generating the clock signal taken, plus a jitter variance introduced by a link transmitting the clock signal between the output of the generation circuit and the node for taking the clock signal, the method comprising determining the jitter variance of the clock signal at the output of the clock signal generation circuit, and the jitter variance introduced by the link between the output of the clock signal generation circuit and the node for taking the clock signal taken, wherein selecting a series of tests comprises determining a number of tests of the series of tests and the signals taken at each test of the series of tests so as to be able to determine by the matrix calculation the jitter variance of each clock signal at the output of the generation circuit thereof and the jitter variance of each link between a selected point for taking a clock signal and the output of the clock signal generation circuit.

24. The non-transitory computer readable medium of claim 22 wherein performing the series of tests comprises taking a sample of a first out of the two taken signals at each period of a second of the taken signals, and storing the samples taken, the events counted comprising events of apparition of a particular pattern or matching a particular mask, in the stored samples, and events of phase matching between the two taken signals.

25. The non-transitory computer readable medium of claim 24 wherein the test result of each test of the series of tests is obtained by a following formula:

$$R = \left( \frac{NA + NB}{NTc} \cdot |Tobs - Tref| \right)^2$$

where R is the result of the test, NA and NB are the values of two counters of apparition of a particular pattern in the stored samples or matching the stored samples with a particular mask, NTc is the value of a counter incremented each time the two taken signals are detected in phase, and Tobs and Tref are periods of the two taken signals.

26. The non-transitory computer readable medium of claim 22 wherein the integrated circuit comprises at least one block configured to analyze supply voltage integrity and having a jitter measurement circuit and multiplexers configured to select taking nodes for taking clock signals.

27. The non-transitory computer readable medium of claim 22, the method comprising performing the series of tests in various operating conditions of the integrated circuit, comparing jitter variances obtained at each series of tests, and deducing therefrom information relating to an integrity of supply voltages.

28. A system, comprising:
means for selecting a series of at least three tests of an integrated circuit;
means for performing the selected series of at least three tests on the integrated circuit, each test comprising:
selecting two nodes among at least three taking nodes for taking clock signals, from the integrated circuit;
taking two clock signals at the two selected taking nodes during a test duration;
detecting and counting events appearing in a jitter signal between the two clock signals taken, during the test duration; and
determining from numbers of events counted, a test result proportional to a sum of jitter variances of the two clock signals taken during the test duration, wherein each of three clock signal taking nodes is selected for at least one of the tests of the series of at least three tests; and
means for determining a jitter variance of each clock signal taken during the series of tests using a matrix calculation based on the results of the series of tests.

29. The system of claim 28 wherein the jitter variance of a clock signal taken at a node at a distance from a clock signal generator is equal to a jitter variance of the clock signal at the clock signal generator plus a jitter variance introduced by a link transmitting the clock signal between the clock signal generator and the node for taking the clock signal, the system comprising means for determining the jitter variance of the clock signal at the clock signal generator, and the jitter variance introduced by the link between the output of the clock signal generator and the node for taking the clock signal taken, wherein the means for selecting a series of tests comprises means for determining a number of tests of the series of tests and the signals taken at each test of the series of tests so as to be able to determine by the matrix calculation the jitter variance of each clock signal at the output of the generation circuit thereof and the jitter variance of each link between a selected point for taking a clock signal and the output of the clock signal generator.

30. The system of claim 28 wherein the means for performing is configured to take a sample of a first out of the two taken signals at each period of a second of the taken signals, and store the samples taken, the events counted comprising events of apparition of a particular pattern or matching a particular mask, in the stored samples, and events of phase matching between the two taken signals.

* * * * *